United States Patent [19]
Hedberg

[11] Patent Number: 5,726,582
[45] Date of Patent: Mar. 10, 1998

[54] CONTROL CIRCUIT FOR KEEPING CONSTANT THE IMPEDANCE OF A TERMINATION NETWORK

[75] Inventor: Mats Hedberg, Haninge, Sweden

[73] Assignee: Telefonaktiebolget LM Ericsson, Stockholm, Sweden

[21] Appl. No.: 393,898

[22] Filed: Feb. 24, 1995

[30] Foreign Application Priority Data

Feb. 25, 1994 [SE] Sweden ............................ 9400657

[51] Int. Cl.$^6$ ........................................... H03K 17/14
[52] U.S. Cl. ............................ 326/30; 326/21; 327/538
[58] Field of Search ........................... 326/21, 30, 62; 327/309, 310, 318, 312, 321, 538, 540, 541, 543; 333/22 R; 379/394, 398

[56] References Cited

U.S. PATENT DOCUMENTS

| | | | |
|---|---|---|---|
| 4,327,320 | 4/1982 | Oguey et al. | 323/313 |
| 4,719,369 | 1/1988 | Asano et al. | 326/30 |
| 4,748,426 | 5/1988 | Stewart | 326/30 |
| 4,760,292 | 7/1988 | Bach | 326/32 |
| 4,837,459 | 6/1989 | Bukowski et al. | 327/543 |
| 4,918,336 | 4/1990 | Graham et al. | 326/31 |
| 4,924,113 | 5/1990 | Schade, Jr. | 327/541 |
| 5,030,856 | 7/1991 | Dansky et al. | 326/66 |
| 5,043,605 | 8/1991 | Gabara | 326/30 |
| 5,047,657 | 9/1991 | Seevinck et al. | 326/62 |
| 5,175,451 | 12/1992 | Ihara | 327/538 |
| 5,341,039 | 8/1994 | Fukumoto | 326/30 |
| 5,357,156 | 10/1994 | Herrington | 327/309 |
| 5,381,034 | 1/1995 | Thrower et al. | 257/530 |
| 5,381,057 | 1/1995 | Kuroda et al. | 326/126 |
| 5,382,841 | 1/1995 | Feldbaumer | 326/30 |

OTHER PUBLICATIONS

Scott, Donald E., "An Introduction to Circuit Anaylsis, A Systems Approach"; ©1987; pp. 317–318.

*Primary Examiner*—Edward P. Westin
*Assistant Examiner*—Benjamin D. Driscoll
*Attorney, Agent, or Firm*—Burns, Doane, Swecker & Mathis, L.L.P.

[57] ABSTRACT

A termination network in an integrated circuit, and a control circuit for controlling the impedance of the termination network is described. The termination network comprises transistors for matching the impedance of the termination network with the characteristic impedance of a transmission line, which is connected to the termination network. The control circuit comprises a reference transistor which is integrated on the same integrated circuit as the termination network. The control circuit senses the impedance of the reference transistor and controls the reference transistor and the transistors in the termination network in such a way that the impedance is not affected by variations in temperature and in the manufacturing process of the integrated circuit.

11 Claims, 2 Drawing Sheets

CONTROL CIRCUIT FOR KEEPING CONSTANT THE IMPEDANCE OF A TERMINATION NETWORK

TECHNICAL FIELD OF THE INVENTION

The present invention relates to a termination network for electrical impedance matching at the receiving end of a transmission line.

BACKGROUND OF THE DISCLOSURE

Receiving high frequency electrical signals carried over a transmission line requires a termination network at the receiving end of the transmission line. Such a termination network can be integrated with a receiver, for receiving the electrical signals, in an integrated circuit. Passive components, such as resistors, are typically used in the termination network. For a given feasible integrated-circuit technology, the received frequency at which the integrated circuit can be guaranteed to operate reliably is limited by manufacturing-process variations and thermal variations. This limited frequency capability is the result of impedance mismatch between the transmission line and the termination network, because the variations in manufacturing process and temperature affect the termination-network impedance.

With a termination network having an input impedance that accurately matches the characteristic impedance of the transmission line, regardless of temperature variations and process variations, the maximum frequency at which the integrated circuit can be guaranteed to operate would increase.

The problem in the art is hence to implement a termination network in an integrated circuit, such that the frequency at which the integrated circuit can be guaranteed to operate reliably is increased for a given integrated-circuit technology. U.S. Pat. No. 4,837,459 describes a voltage generator which is insensitive to process variations and thermal variations.

It is also known in the art that transistors, e.g. Field Effect Transistors (FET:s), can be used as resistors in a termination network. By controlling these transistors, the impedance of a termination network can be programmed to match various characteristic impedances of connected transmission lines.

DESCRIPTION OF THE INVENTION

The object of the present invention is to solve the aforementioned problem of implementing a termination network in an integrated circuit, such that the frequency at which the integrated circuit can be guaranteed to operate reliably is increased for a given integrated-circuit technology.

This object has been accomplished by provision of a termination network comprising one or more transistors, and a control circuit for controlling the impedance of these transistors. The control circuit comprises a reference transistor which is integrated on the same integrated circuit as the transistors in the termination network. The control circuit comprises means for sensing and controlling the impedance of the reference transistor.

According to the invention, a control circuit controls the impedance of at least one transistor which is included in a termination network. The control circuit compensates for variations in the properties of said transistor, in order to uphold a constant impedance of said transistor. These variations are caused by e.g. thermal variations, and by variations in the manufacturing process (tolerances).

The control circuit comprises a reference transistor which is located on the same integrated circuit as the transistor in the termination network. Both transistors are hence processed together during manufacturing. The transistors are located in such proximity, that they operate in the same thermal environment. The properties of the reference transistor reflect the properties of the transistor in the termination network, since both transistors are processed together during manufacturing, and operate in the same thermal environment. The transistors are typically of the same type, thereby having essentially identical properties.

The control circuit has a feedback arrangement which controls the reference transistor in such a way, that the impedance of the reference transistor is kept constant. The control signal thereby required to control the reference transistor is also used for controlling the transistor in the termination network. Both transistors hence share the same control signal, and having essentially identical properties, the transistor in the termination network will also exhibit a constant impedance, i.e., an impedance which is not affected by variations in temperature and by variations in the manufacturing process.

The impedance of the termination network can hence be made to always accurately match the characteristic impedance of the transmission line, which in turn permits higher operating frequencies.

By exercising the invention, the development of new process technologies needs not be stressed as hard. Other advantages of the invention include usage of cheaper process technologies. The advantages of the invention will become clearer from the description of the various embodiments of the invention.

BRIEF DESCRIPTION OF DRAWINGS

The present invention will now be described in closer detail, with reference to the attached drawings, in which.

DETAILED DESCRIPTION OF EMBODIMENTS OF THE INVENTION

Figure 1:
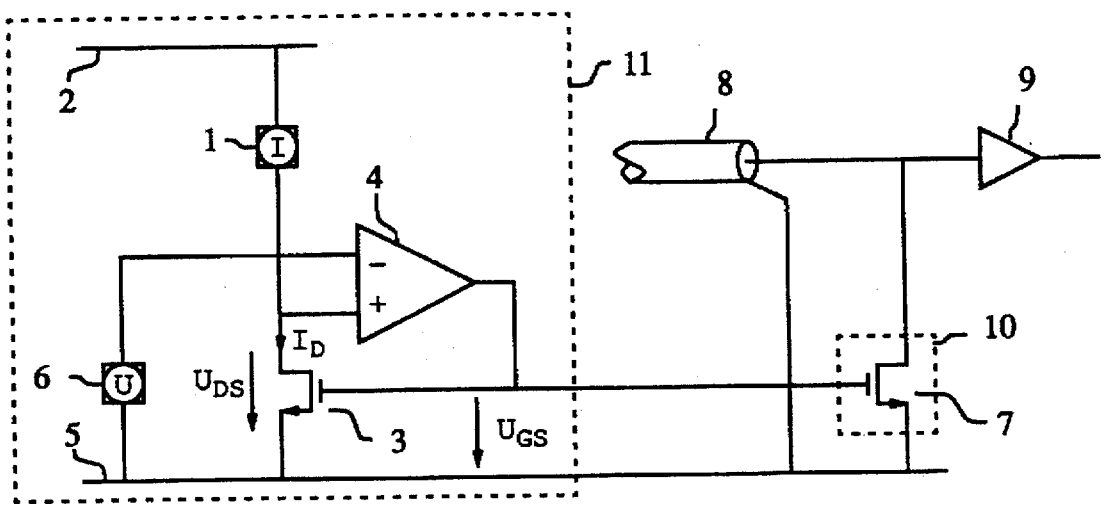
FIG. 1 shows a schematic of a first embodiment of the invention, comprising a termination network and a control circuit.

A first embodiment of the present invention is shown in FIG. 1. The input of a current generator 1 is connected to a supply voltage 2, and the output of the current generator is connected to the drain terminal of an NMOS transistor 3, and to the positive input of an operational amplifier 4. The source terminal of the transistor is connected to ground 5. The positive terminal of a voltage generator 6 is connected to the negative input of the operational amplifier. The negative terminal of the voltage generator is connected to ground. The output of the operational amplifier is connected to the gate of the transistor 3, and to the gate of an NMOS transistor 7 of the same type as transistor 3. The output terminal of a transmission line 8 is connected to the drain terminal of the transistor 7, and to the input of a buffer 9. The ground terminal of the transmission line is connected to ground, although not necessarily as shown. The source terminal of the transistor 7 is connected to ground.

The function of the circuitry will now be explained. A transmitter, not shown, sends signals through the transmission line 8. These signals are being received by the buffer 9. A termination network 10 terminates the transmission line. The termination network comprises, for the sake of simplicity, the single transistor 7. A control circuit 11 keeps the impedance of this transistor 7 constant, irrespective of variations in the manufacturing process or variations in temperature. This constant impedance is set to match the characteristic impedance of the transmission line. The impedance is set by properly choosing the voltage of voltage generator 6 and the current of current generator 1, which will be further explained.

The operational amplifier operates in a negative feedback mode. The voltage $U_{DS}$ across the reference transistor 3 is hence virtually the same as the voltage of the voltage generator. Furthermore, the current $I_D$ through the reference transistor 3 is virtually the same as the current sourced by the current generator 1. The impedance of the reference transistor 3 is therefore dictated by the voltage/current ratio ($U_{DS}/I_D$).

It is essential that this ratio is kept constant, otherwise the impedance of the reference transistor will not be constant. A constant voltage/current ratio can be achieved by accurate voltage and current generators, which are known per se.

The impedance of transistor 3 will be reflected in transistor 7, as both transistors 3,7 have identical properties and both transistors 3,7 are controlled by the same control voltage $U_{GS}$, from the output of the operational amplifier.

The impedance of the transistor 7 is hence constant (within a relevant operating range) and equal to the aforementioned voltage/current ratio.

Figure 2:
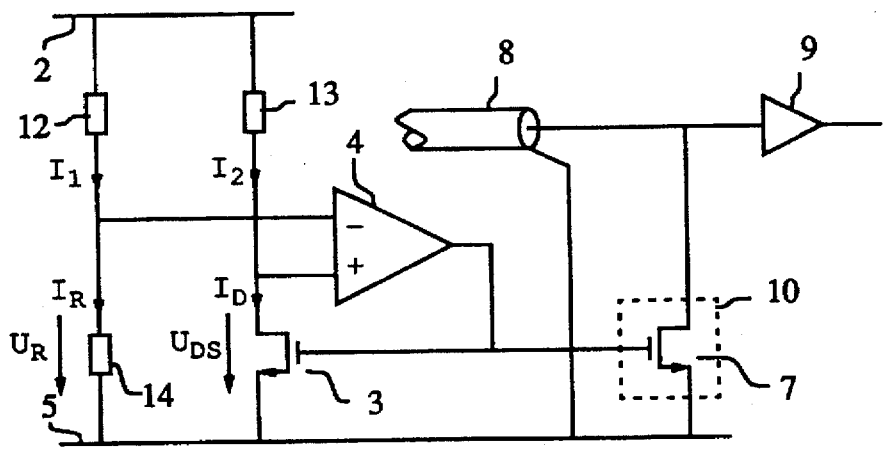
FIG. 2 shows a second embodiment of the invention which is slightly modified from the first embodiment.

A second embodiment of the invention, which is shown in FIG. 2, eases a stringent requirement of accurate generation of voltage and current.

The circuitry differs in that the current generator 1 is replaced by a resistor 13, and the voltage generator 6 is replaced by a resistor network consisting of a resistor 12 connected to the supply voltage and to the negative input of the operational amplifier, and a resistor 14 connected to ground and to the same negative input of the operational amplifier.

The two resistors 12,13 have, for the sake of simplicity, the same nominal impedance. They are integrated on the same integrated circuit, typically on the same integrated circuit which accommodates the termination network. The impedance of these resistors 12,13 will hence be virtually identical, although not necessarily constant.

As in the previous embodiment, the electrical balance attained through the feedback arrangement results in virtually identical voltages on both inputs of the operational amplifier. The currents $I_1, I_2$ through the resistors 12,13 are therefore virtually equal.

Since the currents $I_1, I_2$ through the resistors 12,13 are virtually equal, the current $I_R$ through the resistor 14 will be virtually equal to the current $I_D$ through the transistor 3.

Since also the voltage $U_R$ across the resistor 14 is virtually equal to the voltage $U_{DS}$ across the transistor 3, the impedance of the reference transistor 3 will be virtually equal to the impedance of the resistor 14. The impedance of transistor 7 is hence also equal to the impedance of resistor 14. The impedance of transistor 7 is independent of variations in the supply voltage, and depends only on the impedance of the resistor 14.

The resistor 14 may be located outside the integrated circuit, in which case its impedance is independent of the properties of the integrated circuit.

In an integrated-circuit technology less sensitive to thermal variations, the resistor 14 can be integrated on the integrated circuit, provided the impedance of said resistor 14 can be adjusted (trimmed), e.g. by laser.

The advantage may not be apparent at first, as a resistor based termination network can then also be trimmed, but considering that the termination network may accommodate several resistors, of which each one would have to be trimmed, it is clear that trimming of a single resistor is advantageous.

Figure 3:
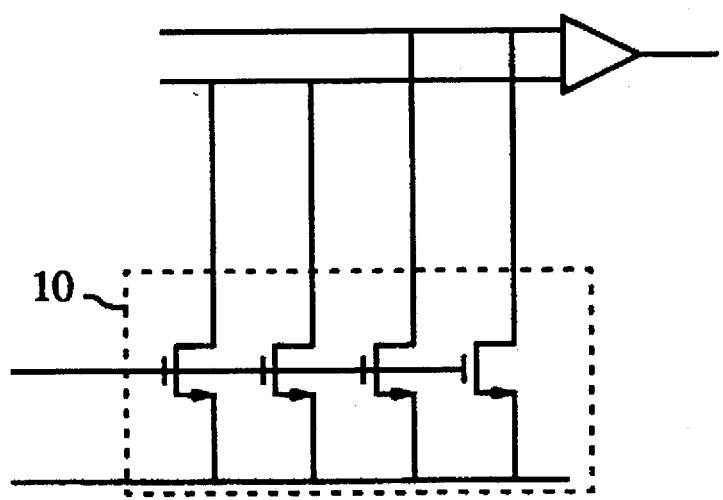
FIG. 3 shows a termination network comprising more than one transistor.

A termination network for terminating balanced signals is shown in FIG. 3. The termination network comprises four transistors. Both N-channel and P-channel transistors can be used without departing from the scope and the spirit of the invention. It is also within the scope and the spirit of the invention that the reference transistor and the transistors in the termination network are of different types, and that the current $I_1$ is proportional to the current $I_2$. The necessary alterations that would have to be carried out on the circuitry are obvious to a person skilled in the art. It is also obvious to a person skilled in the art, that more than one termination network pertaining to different signal receivers can be controlled by the same control circuit. The ground reference can be set to any level, and the termination network needs not be grounded as shown.

What is claimed is:

1. A termination network and a control circuit for controlling the termination network, said termination network being integrated on an integrated circuit and comprising at least one matching transistor for electrical impedance matching at the receiving end of a transmission line, wherein said control circuit comprises a reference transistor which is integrated on the same integrated circuit as said at least one matching transistor of the termination network, said control circuit further comprises means for sensing and keeping substantially constant the impedance of said reference transistor.

2. A termination network and a control circuit according to claim 1, wherein a reference resistor is discrete from the integrated circuit, whereby an impedance of the reference resistor is independent of properties of the integrated circuit.

3. A termination network and a control circuit according to claim 2, wherein the control circuit comprises an operational amplifier.

4. A termination network and a control circuit according to claim 1, wherein a reference resistor is located on said integrated circuit, and said reference resistor is trimmable.

5. A termination network and a control circuit according to claim 1, wherein said control circuit comprises a reference resistor, the impedance of said reference resistor being used for controlling the impedance of said reference transistor.

6. A termination network and a control circuit in accordance with claim 5, wherein said reference resistor is discrete from the integrated circuit, whereby an impedance of the reference resistor is independent of properties of the integrated circuit.

7. A termination network and a control circuit in accordance with claim 5, wherein said reference resistor is located on said integrated circuit and said reference resistor is trimmable.

8. A control circuit for controlling at least one transistor integrated in an integrated circuit, comprising:

a reference transistor, integrated on the same integrated circuit as the at least one transistor, for attaining properties of the reference transistor which reflect properties of the at least one transistor; and control means, which controls a gate of the reference transistor, for keeping substantially constant a ratio of a voltage across the reference transistor and a current through the reference transistor;

wherein the ratio is kept substantially constant irrespective of variations in temperature, supply voltage, and manufacturing process; and the control means also controls a gate of the at least one transistor, whereby an impedance of the at least one transistor is kept substantially constant.

9. The control circuit of claim 8, wherein the control means comprises:

a first resistor integrated in an integrated circuit;

a second resistor integrated in the integrated circuit in which the first resistor is integrated;

a reference resistor through which a first current is drawn from the first resistor, wherein the reference resistor is arranged such that its impedance is substantially constant, irrespective of variations in temperature; and an operational amplifier for sensing a voltage across the reference transistor and for controlling a gate of the reference transistor;

wherein a second current is drawn from the second resistor through the reference transistor such that the voltage across the reference transistor is substantially equal to a voltage across the reference resistor, whereby the first current and the second current are proportional and the impedance of the reference transistor is proportional to the impedance of the reference resistor.

10. A method of controlling an impedance of a transistor of a termination network integrated in an integrated circuit, comprising the steps of:

disposing a reference transistor having properties proportional to the transistor of the termination network in thermal proximity with the transistor of the termination network;

keeping a ratio between a voltage across the reference transistor and a current through the reference transistor substantially constant in response to a control signal, irrespective of variations in temperature and manufacturing process; and using the control signal for controlling the impedance of the transistor of the termination network.

11. The method of claim 10, comprising the steps of:

processing the reference transistor and the transistor of the termination network together during manufacturing to obtain properties of the reference transistor that are proportional to properties of the transistor of the termination network;

accommodating a reference resistor, discrete from the integrated circuit, for attaining an impedance of the reference resistor that is substantially constant;

accommodating a first resistor and a second resistor on one integrated circuit for attaining substantially equal properties of the first resistor and the second resistor;

drawing a first current from the first resistor through the reference transistor;

sensing a voltage across the reference resistor and the voltage across the reference transistor; and in response to the sensed voltages, controlling a gate of the reference transistor such that the voltage across the reference resistor and the voltage across the reference transistor are substantially equal.

* * * * *